US 7,684,272 B2

(12) United States Patent
Matsubara

(10) Patent No.: US 7,684,272 B2
(45) Date of Patent: Mar. 23, 2010

(54) SEMICONDUCTOR MEMORY DEVICE WITH TRANSFER SWITCH AND METHOD OF OPERATING THE DEVICE

(75) Inventor: Yasushi Matsubara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/945,282

(22) Filed: Nov. 27, 2007

(65) Prior Publication Data

US 2008/0137457 A1 Jun. 12, 2008

(30) Foreign Application Priority Data

Dec. 7, 2006 (JP) ............................. 2006-331212

(51) Int. Cl.
*G11C 7/00* (2006.01)
(52) U.S. Cl. ...................... 365/203; 365/207; 365/196; 365/189.03
(58) Field of Classification Search .................. 365/203, 365/207, 196, 189.03
See application file for complete search history.

(56) References Cited

U.S. PATENT DOCUMENTS 6,144,599 A * 11/2000 Akita et al. .................. 365/203
6,181,618 B1 * 1/2001 Inaba et al. .................. 365/203
7,102,935 B2 * 9/2006 Miki et al. ............. 365/189.09
7,394,709 B2 * 7/2008 Mori et al. ................... 365/203

FOREIGN PATENT DOCUMENTS

| JP | 05-159575 | 6/1993 |
| JP | 08-190790 | 7/1996 |
| JP | 2002-157885 | 5/2002 |
| JP | 2005-243158 | 9/2005 |
| JP | 2006-228261 | 8/2006 |

OTHER PUBLICATIONS

Japanese Patent Office issued a Japanese Office Action dated Dec. 24, 2008, Application No. 2006-331212.
Japanese Patent Office issued a Office Action dated Sep. 15, 2009, Application No. 2006-331212.

* cited by examiner

*Primary Examiner*—Connie C Yoha
(74) *Attorney, Agent, or Firm*—Young & Thompson

(57) ABSTRACT

A semiconductor memory device includes a sense amplifier SA, a pair of bit lines BLT, BLB, a transfer switch SW provided between the sense amplifier SA and the pair of bit lines BLT, BLB, a precharge circuit PC that precharges the sense amplifier SA and the pair of bit lines BLT, BLB at the same potential, and a control circuit CTL. The control circuit CTL sets the transfer switch SW in the off state in the state before data is written or read, and turns on the transfer switch SW when writing or reading data via the pair of bit lines BLT, BLB. With this arrangement, a defective current flowing to the sense amplifier SA can be decreased, even when a word line WL and a bit line BL are shortcircuited.

9 Claims, 4 Drawing Sheets

SEMICONDUCTOR MEMORY DEVICE WITH TRANSFER SWITCH AND METHOD OF OPERATING THE DEVICE

TECHNICAL FIELD

The present invention relates to a semiconductor memory device and a control method thereof, and more particularly, relates to a semiconductor memory device provided with a transfer switch between a sense amplifier and a bit line, and a control method thereof.

BACKGROUND OF THE INVENTION

A memory density of a semiconductor memory device as represented by a DRAM (Dynamic Random Access Memory) increases annually along with the progress of microfabrication. However, the actual situation is that along with the progress of miniaturization, the number of defective memory cells included in one chip also increases progressively. Such a defective memory cell is usually replaced by a redundant memory cell, thereby relieving a defective address.

In the case of the DRAM, the defect includes a refresh defect in which information holding time is shorter than a prescribed value ($t_{REF}$), and a short failure in which a word line and a bit line are shortcircuited due to a manufacturing failure. Regarding the refresh defect, the address can be relieved by replacing a defective memory cell with a redundant memory cell. On the other hand, when the word line and the bit line are shortcircuited, not only the defective word line needs to be replaced with a redundant word line, but also the defective bit line needs to be replaced with a redundant bit line.

When this address replacement is carried out, valid addresses are not allocated to the defective word line and the defective bit line, and, therefore, memory cells corresponding to these addresses are not accessed. In other words, the defective word line is always maintained at an inactive level, and even when any address is supplied, the address is not changed to an active level.

However, because a precharge operation is also carried out to the defective bit line, when the word line and the bit line are shortcircuited, a current flows from the defective bit line at the precharge level to the defective word line at the inactive level. Therefore, there is a problem that total power consumption of chips increases.

As a method of decreasing such a defective current, a method of adding a current limit element to a bit line precharge circuit is proposed (Japanese Patent Application Laid-open No. 2005-243158). However, when the current limit element is added to the bit line precharge circuit, a P-channel MOS transistor included in a sense amplifier is slightly turned on, because the bit line shortcircuited with the word line is always kept at the inactive level of the word line. As a result, although a defective current flowing from the word line to the bit line decreases, a defective current via the sense amplifier occurs. For the same reason, a defective current also flows to a transistor connecting the bit line and a local I/O line.

This problem becomes noticeable when the inactive level of the word line is set to a value below the ground level.

On the other hand, in a shared-sense type DRAM, a transfer switch is often provided between a sense amplifier and a bit line pair. However, in a semiconductor memory device of a type that precharges the sense amplifier and the bit line pair at the same potential, a configuration of precharging within the sense amplifier from the bit line side is mainly employed. Therefore, during the non-access period, the transfer switch always needs to be in the on state. Accordingly, this type of a semiconductor memory device also has a problem that a defective current continues flowing to the sense amplifier via the transfer switch.

As described in Japanese Patent Application Laid-open No. 2002-157885, in a semiconductor memory device of a type that precharges the sense amplifier and the bit line pair at different potentials, the transfer switch is set in the off state during the non-access period. Therefore, defective current does not flow to the sense amplifier in this state. However, the semiconductor memory device of this type has a problem in that the control is complex and the sense operation is slow.

SUMMARY OF THE INVENTION

It is therefore an object of the present invention to provide an improved semiconductor memory device of a type that precharges the sense amplifier and bit lines at the same potential that can decrease a defective current flowing through a sense amplifier.

Another object of the present invention is to provide an improved method of controlling a semiconductor memory device of a type that precharges the sense amplifier and bit lines at the same potential that can decrease a defective current flowing through a sense amplifier.

A semiconductor memory device according to one aspect of the present invention comprising a sense amplifier, a pair of bit lines connected to the sense amplifier, a transfer switch provided between the sense amplifier and the pair of bit lines, a precharge circuit that precharges the sense amplifier and the pair of bit lines at the same potential, and a control circuit that controls at least the transfer switch and the precharge circuit, wherein the control circuit sets the transfer switch in the off state in the state before data writing or reading is performed, and turns on the transfer switch when data is to be written or read via the pair of bit lines.

A method of controlling a semiconductor memory device according to one aspect of the present invention comprising a sense amplifier, a pair of bit lines connected to the sense amplifier, a transfer switch provided between the sense amplifier and the pair of bit lines, and a precharge circuit that precharges the sense amplifier and the pair of bit lines at the same potential, wherein the transfer switch is set in the off state in the state before data writing or reading is performed, and the transfer switch is turned on when data is to be written or read via the pair of bit lines.

In the present invention, signification of "writing and reading of data" includes the refresh operation that does not actually involve the input and output of data.

In the present invention, in the state before writing or reading data, a transfer switch is turned off. Therefore, the inside of a sense amplifier needs to be precharged at the same potential as that of a bit line pair. As a method of achieving this, there is a method of turning on a transfer switch before a precharge circuit connected to the bit line pair is changed from the active state to the inactive state. Alternatively, there is a method of connecting a separate precharge circuit within the sense amplifier. The precharge circuit connected within the sense amplifier does not require a current limit element, and, therefore, the increase of the occupied area can be minimized.

According to the present invention, in the state before writing or reading data, the transfer switch is kept in the off state. Therefore, even when the word line and the bit lines are shortcircuited due to a manufacturing failure, a defective current flowing through the sense amplifier can be decreased considerably. Further, because the precharge circuit precharges so that the sense amplifier and the pair of bit lines become at the same potential, a high-speed sense operation can be carried out by a simple control.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will be explained below with reference to the accompanying drawings.

Figure 1:
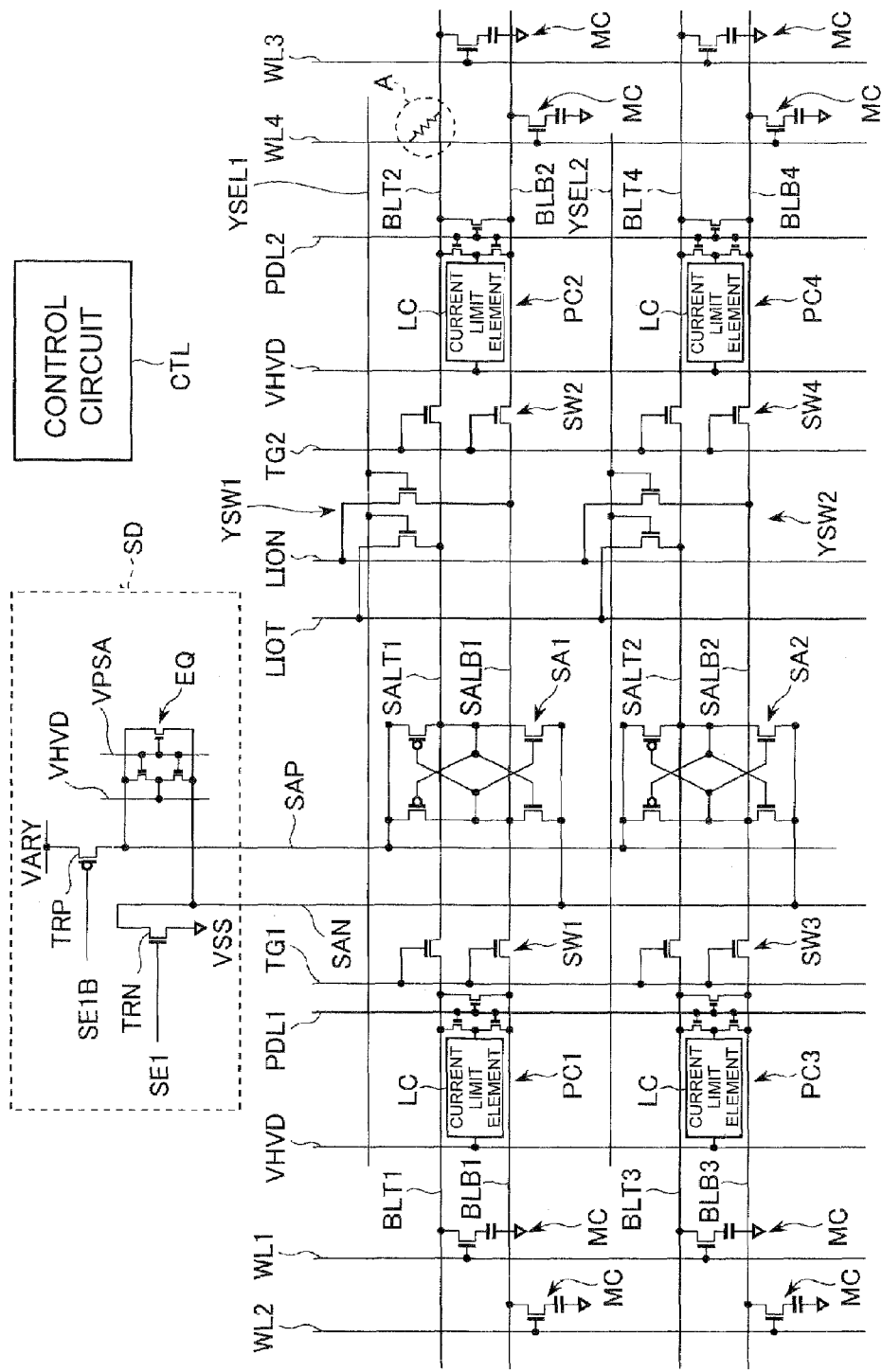
FIG. 1 is a circuit diagram indicating a configuration of main parts of a semiconductor memory device according to a preferred first embodiment of the present invention.

FIG. 1 is a circuit diagram indicating a configuration of main parts of a semiconductor memory device according to a preferred first embodiment of the present invention.

The semiconductor memory device according to the present embodiment is a shared-sense type DRAM. As shown in. FIG. 1, a sense amplifier SA1 is connected with a pair of bit lines BLT1 and BLB1 and a pair of bit lines BLT2 and BLB2. A sense amplifier SA2 is connected with a pair of bit lines BLT3 and BLB3 and a pair of bit lines BLT4 and BLB4. In the present specification, these bit lines are also simply collectively called a bit line BL.

A transfer switch SW1 controlled by a control signal TG1 is provided between the sense amplifier SA1 and the pair of bit lines BLT1 and BLB1. A transfer switch SW2 controlled by a control signal TG2 is provided between the sense amplifier SA1 and the pair of bit lines BLT2 and BLB2. Similarly, a transfer switch SW3 controlled by the control signal TG1 is provided between the sense amplifier SA2 and the pair of bit lines BLT3 and BLB3. A transfer switch SW4 controlled by the control signal TG2 is provided between the sense amplifier SA2 and the pair of bit lines BLT4 and BLB4. As explained above, the transfer switches SW1 and SW3 are on/off controlled by the common control signal TG1, and the transfer switches SW2 and SW4 are on/off controlled by the common control signal TG2.

These bit lines BLs cross plural word lines WL1 to WL4, and a memory cell MC is connected to a predetermined intersection. Because the semiconductor memory device according to the present embodiment is a DRAM, the memory cell MC has a configuration of one transistor and one capacitor.

As shown in FIG. 1, precharge circuits PC1 to PC4 are connected to bit line pairs, respectively. Each of the precharge circuits PC1 to PC4 is a circuit that precharges the corresponding bit line pair at a precharge potential VHVD, and includes three transistors and a current limit element LC. A precharge signal PDL1 or PDL2 is supplied to the gates of these three transistors. When the corresponding precharge signal is activated, the bit line pair is connected to a power source wiring to which the precharge potential VHVD is supplied, and the bit line pair is shortcircuited at the same time. When the precharge signal is activated accordingly, the potential of the corresponding bit line pair becomes the precharge potential VHVD.

The precharge signal PDL1 is a signal common to the precharge circuits PC1 and PC3, and the precharge signal PDL2 is a signal common to the precharge circuits PC2 and PC4.

In the present embodiment, a precharge circuit is not provided in the sense amplifier region, that is, the region between the transfer switch SW1 (SW3) and the transfer switch SW2 (SW4). Therefore, the sense amplifier cannot be precharged when both transfer switches are in the off state. In FIG. 1, the wiring between the transfer switch SW1 and the transfer switch SW2 is expressed as a pair of sense amplifier wirings SALT1 and SALB1, and the wiring between the transfer switch SW3 and the transfer switch SW4 is expressed as a pair of sense amplifier wirings SALT2 and SALB2.

As shown in FIG. 1, in the present example, the bit line BLT2 and the word line WL4 are shortcircuited in the area A due to a manufacturing failure. Therefore, the pair of bit lines BLT2 and BLB2 is address-replaced to redundant bit lines not shown. Similarly, the word line WL4 is address-replaced to a redundant word line not shown. Accordingly, a valid address is not allocated to the memory cell MC connected to the bit line BLT2 or the word line WL4, and the memory cell MC is not accessed.

The sense amplifiers SA1 and SA2 are driven by a sense drive circuit SD. The sense drive circuit SD includes a driver TRN that supplies a low potential VSS to a low drive wiring SAN, and a driver TRP that supplies a high potential VARY to a high drive wiring SAP. The low potential VSS is a low level potential to be written to the memory cell MC, and the high potential VARY is a high level potential to be written to the memory cell MC. An intermediate potential between the low potential VSS and the high potential VARY coincides with the precharge potential VHVD.

The sense drive circuit SD has an equalizer EQ connected to between -the low drive wiring SAN and the high drive wiring SAP. The equalizer EQ includes three transistors, and an equalize signal VPSA is supplied to the gates of these three transistors. When the equalize signal VPSA is activated, the precharge potential VHVD is supplied to the low drive wiring SAN and the high drive wiring SAP, and the low drive wiring SAN and the high drive wiring SAP are shortcircuited.

Further, a column switch YSW1 is provided in the sense amplifier region corresponding to the sense amplifier SA1. The column switch YSW1 is a switch that connects the pair of sense amplifier wirings SALT1, SALB1 and a pair of local I/O lines LIOT, LION when a column selection line YSEL1 is activated. Similarly, a column switch YSW2 is provided in the sense amplifier region corresponding to the sense amplifier SA2. The column switch YSW2 is a switch that connects the pair of sense amplifier wirings SALT2, SALB2 and the pair of local I/O lines LIOT, LION when a column selection line YSEL2 is activated.

Each of the control signals described above is generated by the control circuit CTL shown in FIG. 1.

The configuration of the main parts of the semiconductor memory device according to the present embodiment is as described above. The operation of the semiconductor memory device according to the present embodiment is explained next.

Figure 2:
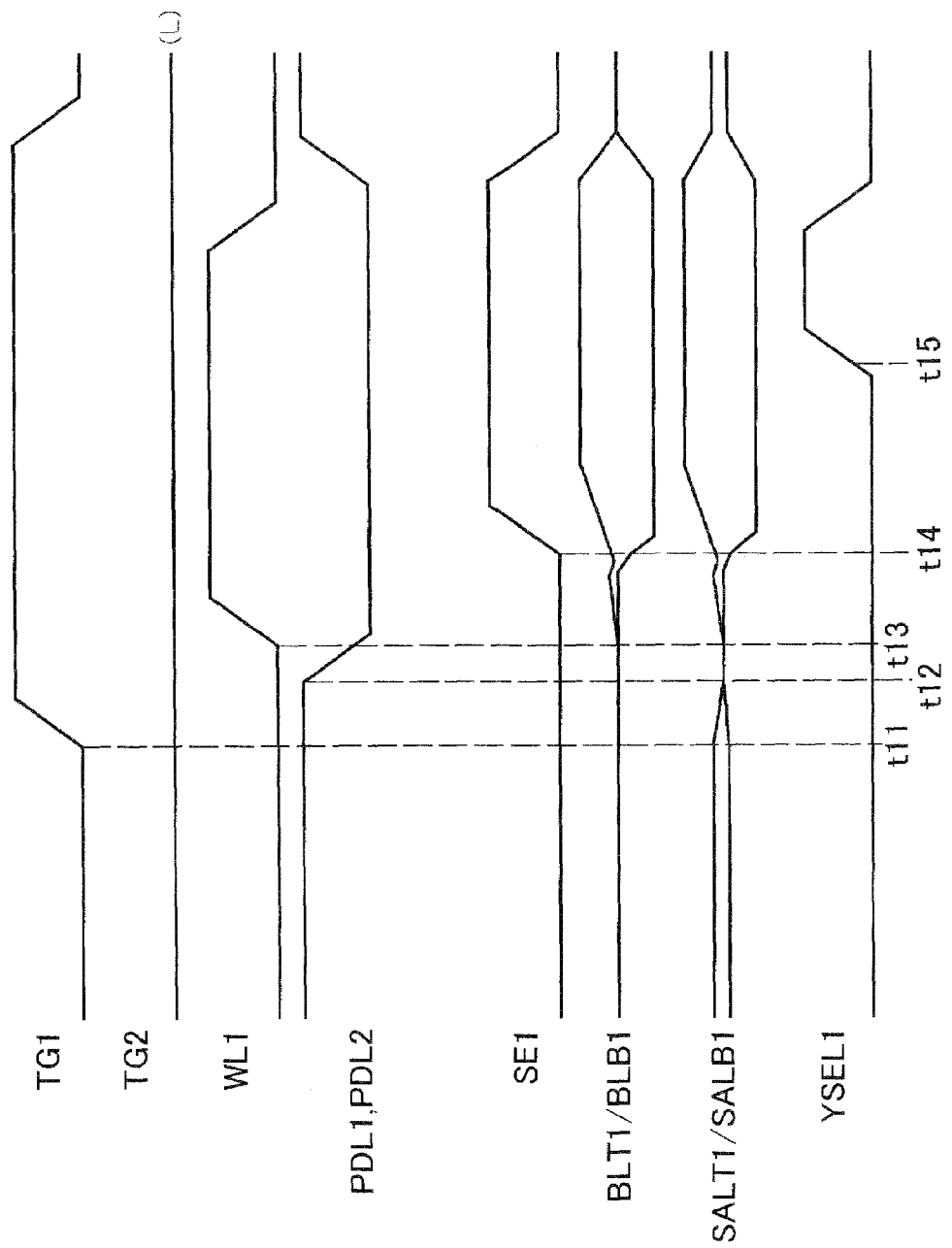
FIG. 2 is a timing diagram indicating the read operation of the semiconductor memory device shown in FIG. 1.

FIG. 2 is a timing diagram indicating the read operation of the semiconductor memory device according to the present embodiment.

First, during a period before reading data (before time t11), the control signals TG1 and TG2 are set to the low level. With this arrangement, all the transfer switches SW1 to SW4 are in the off state. At this time, because the precharge signals PDL1 and PDL2 are at the high level, all the precharge circuits PC1 to PC4 are in the active state, and the bit line BL is precharged at the precharge potential VHVD. All the word lines WL1 to WL4 are at the low level.

At this time, because the bit line BLT2 and the word line WL4 are shortcircuited in the area A shown in FIG. 1, a defective current flows from the bit line BLT2 to the word line WL4. However, because the current limit element LC is provided in the precharge circuit PC2, a defective current flowing from the bit line BLT2 to the word line WL4 is considerably limited. As a result, the potential of the bit line BLT2 substantially decreases to the potential of the word line WL4.

However, during this period, because all the transfer switches SW1 to SW4 are in the off state, a defective current does not flow to the sense amplifier. To securely prevent the defective current of the sense amplifier, it is preferable to set the potentials of the control signals TG1 and TG2 to below the inactive level of the word lines WL1 to WL4. This is because a threshold voltage of the transistor used for the transfer switches SW1 to SW4 is low in general, the defective current cannot be sufficiently blocked unless the potentials of the control signals TG1 and TG2 are set to below the inactive levels of the word lines WL1 to WL4. A minus voltage (lower than the ground potential) is often used for the inactive levels of the word lines WL1 to WL4. In this case, even when the control potentials of the control signals TG1 and TG2 are set to the ground potential, the transfer switches SW1 to SW4 cannot be securely turned off.

During this period, because the transfer switches SW1 to SW4 are in the off state, the sense amplifiers SA1 and SA2 are not precharged. Therefore, there is a possibility that a slight potential difference occurs between the pair of sense amplifier wirings and the pair of bit lines.

Next, the control signal TG1 is changed to the high level at time t11. Accordingly, the transfer switches SW1 and SW3 are turned on. The control signal TG2 is maintained at the low level. Therefore, the transfer switches SW2 and SW4 are maintained in the off state. At this time, because the precharge signals PDL1 and PDL2 are still at the high level, the pair of sense amplifier wirings SALT1 and SALB1 is precharged via the transfer switch SW1. Similarly, the pair of sense amplifier wirings SALT2 and SALB2 is precharged via the transfer switch SW3. Accordingly, the pair of bit lines and the sense amplifiers is precharged at the same potential.

Next, the precharge signals PDL1 and PDL2 are changed to the low level at time t12. Accordingly, the precharge of the bit line BL and the sense amplifiers SA1 and SA2 ends, and reading becomes possible.

The word line WL1 is set to the high level at time t13. Accordingly, the corresponding memory cell MC is connected to the bit lines BLT1 and BLT3. As a result, a potential difference occurs in the pair of bit lines BLT1 and BLB1 (BLT3 and BLB3). In other words, when high-level data is held in the corresponding memory cell MC, the bit line BLT1 (BLT3) becomes at the high potential. When low-level data is held in the corresponding memory cell MC, the bit line BLB1 (BLB3) becomes at the high potential.

Next, sense enable signals SE1 and SE1B are activated at time t14. In other words, the sense enable signal SE1 is set to the high level, and the sense enable signal SE1B is set to the low level. Accordingly, the potential differences occurring in the pair of bit lines, and the pair of sense amplifier wirings are amplified. A column selection line YSEL1 is activated at time t15, and the signal read via the pair of bit lines BLT1 and BLB1 is transferred to the pair of local I/O lines LIOT and LION.

As explained above, in the present embodiment, the transfer switches SW1 to SW4 are set in the off state in the state before data is read, and the transfer switch SW1 (SW3) is turned on at the time of reading data via the pair of bit lines BLT1 and BLB1. Therefore, the bit line BLT2 in which a shortcircuit failure occurs can be disconnected from the sense amplifier SA1, and the occurrence of a defective current via the sense amplifier SA1 can be prevented.

Regarding the pair of bit lines BLT2 and BLB2 and the word line WL4 in which a defect occurs, respectively, their addresses are replaced by the redundant circuit. Therefore, the memory cells MCs corresponding to these lines are not accessed. However, because the control signal TG2 used in the pair of bit lines BLT2 and BLB2 is also used in common in other pair of bit lines BLT4 and BLB4, when the memory cells MCs corresponding to these bit lines are accessed, the control signal TG2 becomes at the high level. In this case, because the transfer switch SW2 is turned on, a defective current occurs in the sense amplifier SA1. However, this defective current occurs during only a short period, and does not occur during a large part of the period. Consequently, a defective current via the sense amplifier can be minimized.

The operation of the semiconductor memory device is explained above taking the example of the data read operation. The data write operation is also similar to the data read operation. In other words, during a period before data is written, all the transfer switches SW1 to SW4 are in the off state, and only the transfer switch corresponding to the memory cell MC into which data is to be read is temporarily set in the on state. This similarly applies to the refresh operation that does not actually involve data input and output operations.

As described above, the semiconductor memory device according to the present embodiment can prevent the occurrence of a defective current via the sense amplifier, because the transfer switches SW1 to SW4 are set in the off state in the state before data is written or read. Further, in writing or reading data, the corresponding transfer switch is turned on before the corresponding precharge circuit is changed from the active state to the inactive state. Therefore, the sense amplifier and the pair of bit lines can be precharged at the same potential without providing a precharge circuit within the sense amplifier.

A preferred second embodiment of the present invention is explained next.

Figure 3:
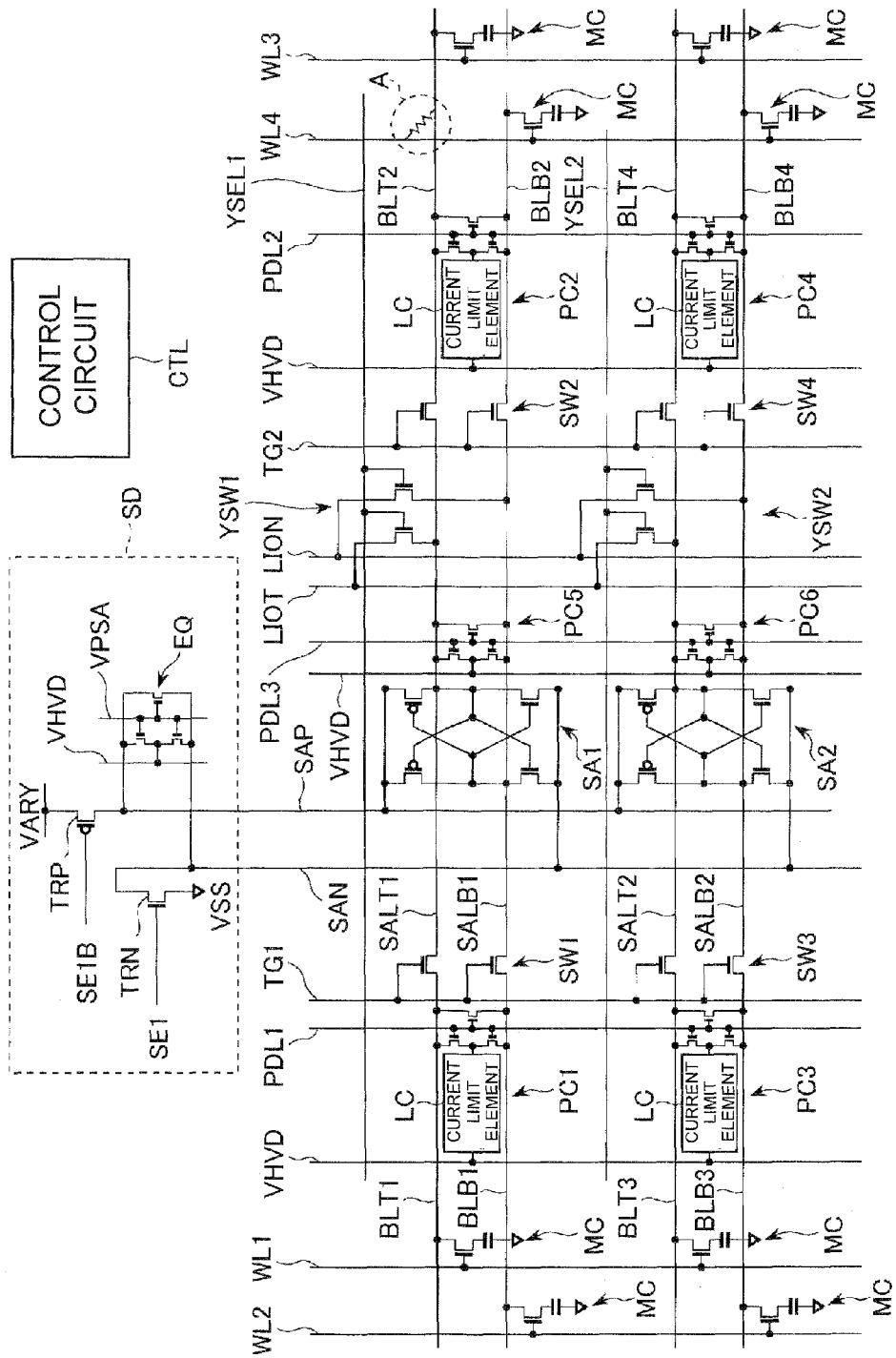
FIG. 3 is a circuit diagram indicating a configuration of main parts of a semiconductor memory device according to the preferred second embodiment of the present invention.

FIG. 3 is a circuit diagram indicating a configuration of main parts of a semiconductor memory device according to the preferred second embodiment of the present invention.

The configuration of the semiconductor memory device according to the present embodiment is different from that of the circuit according to the first embodiment in that precharge circuits PC5 and PC6 are provided within the sense amplifiers SA1 and SA2, respectively. Other configurations of the circuit are the same as those in the first embodiment. Therefore, the same constituent elements are denoted by the same reference numerals, and redundant explanations thereof will be omitted.

The precharge circuits PC5 and PC6 have configurations similar to those of the precharge circuits PC1 to PC4 connected to each bit line pair, and each precharge circuit includes three transistors as shown in FIG. 3. A precharge signal PDL3 is supplied to the gates of the three transistors. When the precharge signal PDL3 is activated, each inside of the sense amplifiers SA1 and SA2 is precharged at the precharge potential VHVD, and the pair of sense amplifier wirings is shortcircuited. Therefore, when the precharge signal PDL3 is activated, the potentials within the sense amplifiers SA1 and SA2 become the precharge potential VHVD, regardless of the state of the transfer switches SW1 to SW4.

Figure 4:
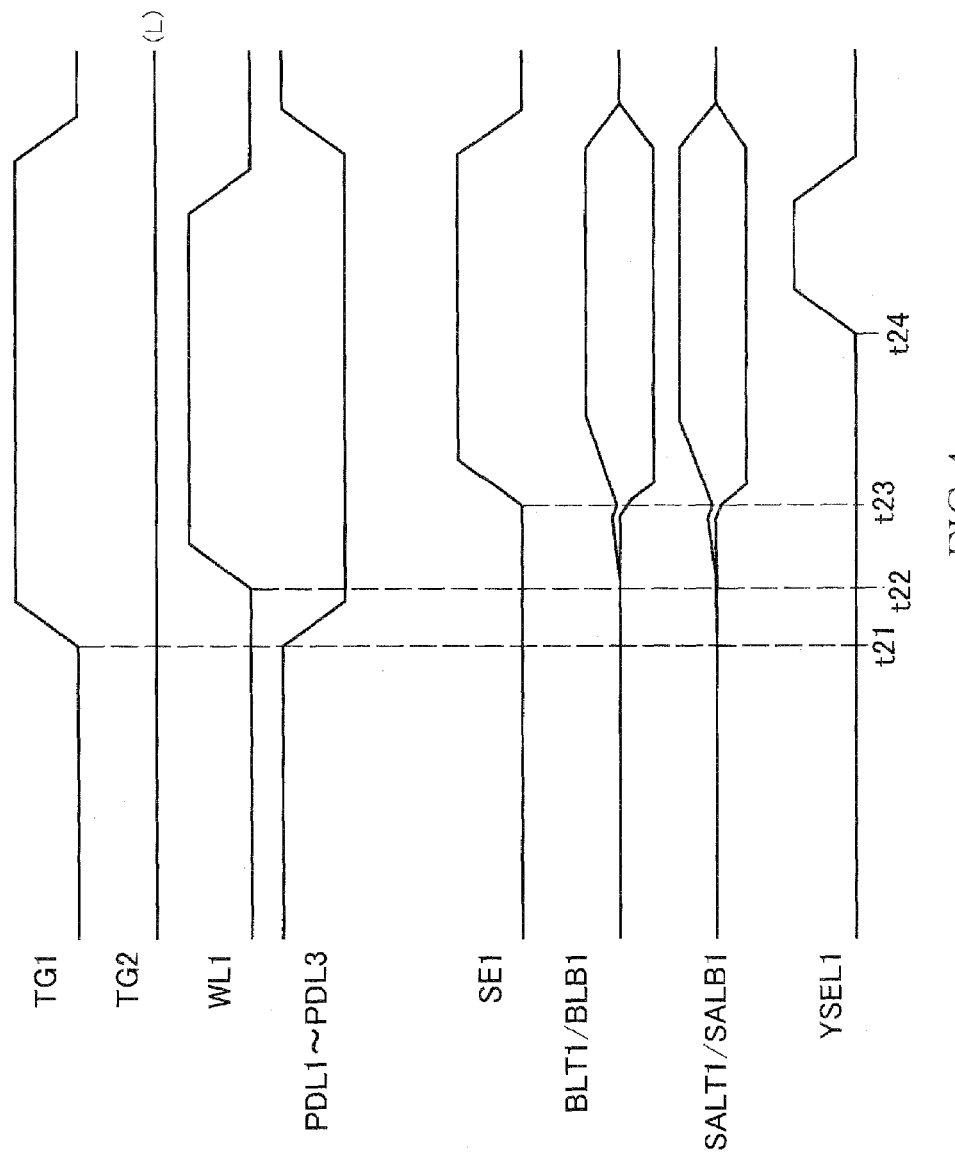
FIG. 4 is a timing diagram indicating the read operation of the semiconductor memory device shown in FIG. 3.

FIG. 4 is a timing diagram indicating the read operation of the semiconductor memory device according to the present embodiment.

First, during the period before data is read, the precharge signals PDL1 to PDL3 are kept at the high level. Accordingly, all the precharge circuits PC1 to PC6 become in the active state. Therefore, all the bit lines BLs and the insides of the sense amplifiers are precharged at the precharge potential VHVD. At this time, both the control signals TG1 and TG2 are at the low level, like in the first embodiment. Because all the transfer switches SW1 to SW4 become in the off state accordingly, no defective current flows to the sense amplifier SA1. In the present embodiment, it is also preferable to set the potentials of the control signals TG1 and TG2 to below the inactive level of the word lines WL1 to WL4.

At time t21, the control signal TG1 is changed to the high level, and the precharge signals PDL1 and PDL3 are changed to the low level. While this operation does not need to be performed entirely simultaneously, it is preferable to perform this operation substantially simultaneously. Accordingly, the transfer switches SW1 and SW3 are turned on, and a readable state is obtained. The control signal TG2 is maintained at the low level, and, therefore, the transfer switches SW2 and SW4 are maintained in the off state.

The subsequent operation is similar to that of the first embodiment. At time t22, the word line WL1 is set to the high level. At time t23, the sense enable signals SE1 and SE1B are activated. At time t24, the column selection line YSEL1 is activated, and the read data is transferred to the pair of local I/O lines LIOT and LION. The operation at the data write time is also similar to the above operation, and the operation at the refresh time actually involving no input and output of data is also similar to the above operation.

As explained above, in the semiconductor memory device according to the present embodiment, the transfer switches SW1 to SW4 are also set in the off state in the state before data is written and read. Therefore, occurrence of a defective current via the sense amplifier can be prevented. Further, in the present embodiment, because the precharge circuits PC5 and PC6 are provided within the sense amplifiers SA1 and SA2, respectively, the control signal and the precharge signal can be changed substantially simultaneously at time t21. Accordingly, a series of sense operation can be performed at high speed and simply.

In the present embodiment, because the precharge circuits PC5 and PC6 are provided within the sense amplifiers SA1 and SA2, respectively, the occupied area of the sense amplifier region becomes larger than that in the first embodiment. However, because the current limit element is not necessary in the precharge circuits PC5 and PC6 provided within the sense amplifiers SA1 and SA2, respectively, the increase of the occupied area can be minimized.

While a preferred embodiment of the present invention has been described hereinbefore, the present invention is not limited to the aforementioned embodiment and various modifications can be made without departing from the spirit of the present invention. It goes without saying that such modifications are included in the scope of the present invention.

For example, in each of the above embodiments, while the application of the present invention to the DRAM is explained, a target to which the present invention is applied is not limited to the DRAM. The invention can be also applied to other kind of semiconductor memory device as long as the semiconductor memory device has a transfer switch provided between the sense amplifier and the bit lines. A target to which the present invention is applied is not limited to the shared-sense type semiconductor memory device either.

In each of the above embodiments, while the transfer switch is set in the off state in the state before data is written or read, the transfer switch in this period can be also set in the off state in only a specific condition.

For example, in only the self refresh operation requiring low power consumption, the transfer switch in this period can be set in the off state. In other words, in the normal data writing or data reading, the transfer switch is set in the on state beforehand, and the operation similar to that in each of the above embodiments is performed during only the self refresh operation. This is particularly preferable for the type of semiconductor memory device having no precharge circuit within the sense amplifier, like in the first embodiment. In other words, during the normal period, the sense operation can be performed at high speed, by setting the transfer switch in the on state beforehand. During the self refresh operation, power consumption can be decreased by setting the transfer switch in the off state beforehand.

The transfer switch can be also set in the off state beforehand, only at a high temperature at which a defective current increases. In other words, when the chip temperature is equal to or lower than a predetermined value, the transfer switch can be set in the on state beforehand, and when the chip temperature exceeds a predetermined value, the operation similar to that of each of the above embodiments is performed. This is also suitable for the type of semiconductor memory device having no precharge circuit within the sense amplifier, like in the first embodiment, and the sense speed and the power consumption can be balanced.

In the case of the semiconductor memory device that performs a partial refresh, the operation similar to that of each of the above embodiments can be performed to only a bank that is left in the standby state.

It is not essential to perform the operation similar to that of each of the above embodiments to all cell plates. In other words, the operation similar to that of each of the above embodiments can be performed to a cell plate in which the word line and the bit line are shortcircuited, and the transfer switch can be set in the on state for other cell plates beforehand. According to this, the total sense operation can be performed at high speed.

What is claimed is:

1. A semiconductor memory device, comprising:
a first memory cell array;
a sense amplifier that reads and writes data from and to the first memory cell array;
a first pair of bit lines connected to the sense amplifier;
a second pair of bit lines connected to the first memory cell array;
a first transfer switch provided between the first pair of bit lines and the second pair of bit lines;
a first precharge circuit connected to the second pair of bit lines and that precharges the first pair of bit lines and the second pair of bit lines at the same potential; and
a control circuit that controls at least the sense amplifier, the first memory cell array, the first transfer switch, and the first precharge circuit,
wherein, before the reading or writing data, the control circuit controls the first transfer switch to be in a non-conductive state and controls the first precharge circuit to be in an active state to set the first pair of bit lines to a first predetermined potential and, via the first precharge circuit, to set the second pair of bit lines to a second predetermined potential different from the first predetermined potential, and wherein, when data is to be written or read via the first and second pairs of bit lines, the control circuit first controls the first transfer switch to be in a conductive state to set the first pair of bit lines to the second predetermined potential via the first precharge circuit, second controls the first precharge circuit to switch from the active state to an inactive state, and third controls the first memory cell array to be in an active state and the sense amplifier to be in an active state.

2. The semiconductor memory device as claimed in claim 1, further comprising a word line that crosses the second pair of bit lines, wherein the control circuit sets a control potential of the first transfer switch to a level equal to or lower than an inactive level of the word line so as to set the first transfer switch to the nonconductive state.

3. The semiconductor memory device as claimed in claim 1, wherein the first precharge circuit is provided with a current limit element that limits the amount of a current flowing through between a power source wiring, to which the second predetermined potential is supplied, and the second pair of bit lines.

4. The semiconductor memory device as claimed in claim 1, further comprising a second memory cell array on an opposite side of the first memory cell array with respect to the sense amplifier, a third pair of bit lines connected to the sense amplifier, a fourth pair of bit lines connected to the second memory cell array, a second transfer switch provided between the third pair of bit lines and the fourth pair of bit lines, and second precharge circuit precharging the third and fourth pairs of bit lines at the same potential, wherein the control circuit controls the second memory cell array, the second transfer switch, and the second precharge circuit, wherein, before the reading or writing data, the control circuit controls the first and second transfer switches to be in a nonconductive state and controls the first and second precharge circuits to be in an active state to set the first and third pairs of bit lines to the first predetermined potential and, via the first precharge circuit, to set two bit lines of the second pair of bit lines and two bit lines of the fourth pair of bit lines to the second predetermined potential, and wherein, when data is to be written or read via the first and second pairs of bit lines, the control circuit first controls the first transfer switch to be in a conductive state to set two bit lines of the first pair of bit lines to the second predetermined potential via the first precharge circuit, second controls the first precharge circuit to switch from the active state to an inactive state, and third controls the first memory cell array to be in an active state and the sense amplifier to be in an active state, and wherein, when data is to be written or read via the third and fourth pairs of bit lines, the control circuit first controls the second transfer switch to be in a conductive state to set two bit lines of the third pair of bit lines to the second predetermined potential via the second precharge circuit, second controls the second precharge circuit to switch from the active state to an inactive state, and third controls the second memory cell array to be in an active state and the sense amplifier to be in an active state.

5. A semiconductor memory device comprising:
a bit line;
a word line;
a memory cell coupled to the bit and word lines;
a precharge circuit coupled to the bit line, the precharge circuit being activated during a first period of time to precharge the bit line;
a sense amplifier including a sense node;
a transfer switch between the bit line and the sense node of the sense amplifier, the transfer switch being turned ON during a second period of time to electrically connect the bit line to the sense node; and
a control circuit controlling the precharge circuit and the transfer switch so that parts of the first and second periods of time overlap, the sense node being precharged by the precharge circuit through the transfer switch and the bit line being precharged while the first and second time periods overlap.

6. The semiconductor memory device in claim 5, wherein the transfer switch is turned OFF during the first period of time not overlapping the second period of time, and the precharge circuit is deactivated during the second period of time not overlapping the first period of time.

7. The semiconductor memory device in claim 5, wherein the sense amplifier performs a read or write operation on the memory cell during the second period of time not overlapping the first period of time.

8. A method of operating a semiconductor memory device that includes a plurality of bit lines, a plurality of word lines, a plurality of memory cells that are each coupled to an associated one of the bit lines and an associated one of the word lines, and a plurality of sense amplifiers, the method comprising:

electrically isolating the sense amplifiers from the bit lines;
starting precharging the bit lines while the sense amplifiers are electrically isolated from the bit lines;
changing the sense amplifiers to being electrically connected to the bit lines while the bit lines are being precharged, the sense amplifiers being precharged at sense nodes thereof from the bit lines; and
stopping precharging the bit lines after the sense nodes have been precharged.

9. The method of claim 8 further comprising:
keeping the sense amplifiers electrically connected to the bit lines after stopping precharging the bit lines; and
performing data read or write operation on one or more selected memory cells while the sense amplifiers are kept electrically connected to the bit lines.

* * * * *